(12) United States Patent
Sakamoto et al.

(10) Patent No.: US 8,102,655 B2
(45) Date of Patent: Jan. 24, 2012

(54) CIRCUIT DEVICE

(75) Inventors: Hideyuki Sakamoto, Gunma (JP); Hidefumi Saito, Gunma (JP); Yasuhiro Koike, Gunma (JP); Masao Tsukizawa, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/837,078

(22) Filed: Jul. 15, 2010

(65) Prior Publication Data

US 2010/0284159 A1    Nov. 11, 2010

Related U.S. Application Data

(63) Continuation of application No. 12/239,250, filed on Sep. 26, 2008, now Pat. No. 7,782,628.

(30) Foreign Application Priority Data

Sep. 27, 2007    (JP) ................... 2007-250483

(51) Int. Cl.
   *H05K 7/20*    (2006.01)
(52) U.S. Cl. ......... 361/723; 361/752; 361/730; 174/520
(58) Field of Classification Search .......... 361/690–693, 361/752, 715, 723, 728, 730; 174/50, 520
   See application file for complete search history.

(56) References Cited

U.S. PATENT DOCUMENTS

| | | | |
|---|---|---|---|
| 4,901,203 A | 2/1990 | Kobayashi et al. | |
| 5,105,322 A | 4/1992 | Steltzer | |
| 5,408,383 A | 4/1995 | Nagasaka et al. | |
| 5,444,297 A | 8/1995 | Oshima et al. | |
| 5,519,252 A | 5/1996 | Soyano et al. | |
| 5,586,388 A | 12/1996 | Hirao et al. | |
| 5,610,799 A | 3/1997 | Kato | |
| 5,646,827 A | 7/1997 | Hirao et al. | |
| 5,657,203 A | 8/1997 | Hirao et al. | |

(Continued)

FOREIGN PATENT DOCUMENTS

JP    10-229288    8/1998

(Continued)

OTHER PUBLICATIONS

Sakamoto et al., U.S. Office Action mailed Nov. 13, 2009, directed to U.S. Appl. No. 12/239,286; 13 pages.

(Continued)

*Primary Examiner* — Dameon Levi
(74) *Attorney, Agent, or Firm* — Morrison & Foerster LLP

(57) ABSTRACT

Provided is a circuit device capable of increasing the packaging density and preventing the thermal interference between circuit elements to be incorporated. In a hybrid integrated circuit device, a first circuit board and a second circuit board are fitted into a case member in a way that the first circuit board is overlaid with the second circuit board. A first circuit element is arranged on the upper surface of the first circuit board and a second circuit element is arranged on the upper surface of the second circuit board. Furthermore, inside the case member, provided is a hollow portion that is not filled with a sealing resin. Such a configuration prevents the second circuit element, which is a microcomputer, from operating unstably due to a heat generated in the first circuit element, which is a power transistor, for example.

7 Claims, 7 Drawing Sheets

U.S. PATENT DOCUMENTS

| | | | |
|---|---|---|---|
| 5,694,294 | A | 12/1997 | Ohashi et al. |
| 5,751,058 | A | 5/1998 | Matsuki |
| 5,777,846 | A | 7/1998 | Hayes et al. |
| 5,967,849 | A | 10/1999 | Shiga et al. |
| 5,995,380 | A | 11/1999 | Maue et al. |
| 6,027,535 | A * | 2/2000 | Eberle et al. .................. 361/690 |
| 6,072,122 | A | 6/2000 | Hosoya |
| 6,081,425 | A * | 6/2000 | Cheng ........................... 361/704 |
| 6,144,571 | A * | 11/2000 | Sasaki et al. .................. 363/144 |
| 6,147,869 | A | 11/2000 | Furnival |
| 6,166,908 | A * | 12/2000 | Samaras et al. ............... 361/700 |
| 6,219,236 | B1 * | 4/2001 | Hirano et al. ................. 361/695 |
| 6,226,182 | B1 * | 5/2001 | Maehara ....................... 361/695 |
| 6,304,448 | B1 | 10/2001 | Fukada et al. |
| 6,348,653 | B1 * | 2/2002 | Cho ............................... 174/383 |
| 6,350,949 | B1 * | 2/2002 | Boyd ........................... 174/50.5 |
| 6,421,244 | B1 * | 7/2002 | Shinohara et al. ............ 361/736 |
| 6,509,629 | B2 | 1/2003 | Yoshimatsu et al. |
| 6,521,983 | B1 * | 2/2003 | Yoshimatsu et al. ......... 257/678 |
| 6,583,355 | B2 | 6/2003 | Skrzypchak |
| 6,690,582 | B2 | 2/2004 | Sumida |
| 6,717,812 | B1 | 4/2004 | Pinjala et al. |
| 6,801,430 | B1 * | 10/2004 | Pokharna ...................... 361/695 |
| 6,958,535 | B2 | 10/2005 | Hirano et al. |
| 6,995,461 | B2 * | 2/2006 | Soyano et al. ................ 257/678 |
| 7,209,367 | B2 | 4/2007 | Nakano et al. |
| 7,218,517 | B2 * | 5/2007 | Wolford et al. ............... 361/695 |
| 7,248,471 | B2 * | 7/2007 | Wabiszczewicz ............. 361/694 |
| 7,375,287 | B2 | 5/2008 | Rathmann |
| 7,589,978 | B1 | 9/2009 | Holdredge et al. |
| 7,623,347 | B2 | 11/2009 | Matsui |
| 7,706,146 | B2 * | 4/2010 | Lee et al. ...................... 361/752 |
| 7,751,194 | B2 * | 7/2010 | Sakamoto et al. ............ 361/719 |
| 7,782,628 | B2 * | 8/2010 | Sakamoto et al. ............ 361/752 |
| 7,839,655 | B2 | 11/2010 | Clark |
| 2008/0204998 | A1 | 8/2008 | Matsui |
| 2009/0086431 | A1 | 4/2009 | Sakamoto et al. |
| 2009/0086442 | A1 * | 4/2009 | Sakamoto et al. ............ 361/729 |
| 2009/0086455 | A1 * | 4/2009 | Sakamoto et al. ............ 361/796 |
| 2009/0103276 | A1 * | 4/2009 | Sakamoto et al. ............ 361/792 |

FOREIGN PATENT DOCUMENTS

| | | |
|---|---|---|
| JP | 2000-228491 | 8/2000 |
| JP | 2007-36014 | 2/2007 |

OTHER PUBLICATIONS

Sakamoto et al., U.S. Office Action mailed Dec. 16, 2009, directed to U.S. Appl. No. 12/239,250; 8 pages.

Sakamoto et al., U.S. Office Action mailed Mar. 30, 2010, directed to U.S. Appl. No. 12/239,256; 6 pages.

Sakamoto et al., U.S. Office Action mailed Sep. 22, 2010, directed to U.S. Appl. No. 12/239,256; 11 pages.

Sakamoto, H. et al. U.S. Office Action mailed Feb. 4, 2011, directed to U.S. Appl. No. 12/239,256; 12 pages.

Sakamoto, H. et al. U.S. Office Action mailed Jun. 23, 2011, directed to U.S. Appl. No. 12/239,256; 13 pages.

Sakamoto, H. et al. U.S. Office Action mailed May 10, 2011, directed to U.S. Appl. No. 12/239,407; 9 pages.

Sakamoto et al., U.S. Office Action mailed Oct. 5, 2011, directed to U.S. Appl. No. 12/239,215; 9 pages.

* cited by examiner

CIRCUIT DEVICE

This application is a continuation of U.S. application Ser. No. 12/239,250, filed Sep. 26, 2008, now U.S. Pat. No. 7,782, 628, which claims priority from Japanese Patent Application Number JP 2007-250483, filed Sep. 27, 2007, the contents of which applications are incorporated herein by reference in their entireties.

BACKGROUND OF THE INVENTION

1. Field of the Invention

The present invention relates to a circuit device, and particularly to a circuit device in which a hybrid integrated circuit formed on an upper surface of a circuit board is sealed with a case member.

2. Description of the Related Art

The configuration of a hybrid integrated circuit device 150 employing a case member 111 is described with reference to FIG. 7. The hybrid integrated circuit device 150 includes: a substrate 101 made of a metal, such as aluminum; an insulating layer 102 formed so as to cover the upper surface of the substrate 101; a conductive pattern 103 formed on the upper surface of the insulating layer 102; and a circuit element 110 such as a transistor electrically connected to the conductive pattern 103. The circuit element 110 is sealed with the case member 111 and a sealing resin 108.

Specifically, the case member 111 has an approximately frame-like shape and is in contact with the side surface of the substrate 101. In addition, in order to secure a sealing space over the upper surface of the substrate 101, the upper end part of the case member 111 is positioned above the upper surface of the substrate 101. Then, the sealing resin 108 is filled in the space surrounded by the case member 111 above the substrate 101 so as to cover the circuit element 110 such as a semiconductor element. With this configuration, the circuit element mounted on the upper surface of the substrate 101 can be sealed with a sealing resin 108 for filling in the space surrounded by the case member 111 or the like, even if the substrate 101 is relatively large.

This technology is described for instance in Japanese Patent Application Publication No. 2007-036014.

In the hybrid integrated circuit device 150 described above, a power transistor, such as an insulated gate bipolar transistor (IGBT), and a driver IC for driving this power transistor are mounted on the upper surface of the substrate 101. In addition, a controlling element, such as a microcomputer for controlling this driver IC, is mounted on the mounting substrate side on which the hybrid integrated circuit device 150 is mounted. Because of this configuration, the area required to mount a circuit which controls for driving a load, such as a motor, has to be large on the mounting substrate side.

In order to solve the above-described problem, provided is a method in which the microcomputer is fixed, for example, to the upper surface of the substrate 101 together with the above-described power transistor or driver IC. This configuration allows the power transistor and the microcomputer to be incorporated into one hybrid integrated circuit device, thereby requires smaller area for mounting the control circuit. However, if the power transistor and the microcomputer are fixed to the upper surface of the same substrate 101, a heat generated in the power transistor is conducted to the microcomputer via the substrate 101 made of a metal such as aluminum. In addition, the heat generated in the power transistor is conducted to the microcomputer via the sealing resin 108 for sealing the entire device. As a result, the microcomputer heated by the power transistor might cause a misoperation.

SUMMARY OF THE INVENTION

The present invention has been made in view of the problems described above. A main object of the present invention is to provide a circuit device capable of increasing the packaging density and suppressing a thermal interference between circuit elements incorporated therein.

A circuit device according to the present invention comprises: a case member; a first circuit board and a second circuit board fitted into the case member and arranged in a way that the first circuit board is overlaid with the second circuit board; a first circuit element fixedly secured to a principal surface of the first circuit board; and a second circuit element fixedly secured to a principal surface of the second circuit board; wherein the first circuit element fixedly secured to the first circuit board is sealed with a sealing resin, the case member is provided therein with a hollow portion which is not filled with the sealing resin.

Furthermore, a circuit device according the present invention comprises: a case member; a first circuit board and a second circuit board fitted into the case member and arranged in a way that the first circuit board is overlaid with the second circuit board; a first circuit element, which is a power transistor, fixedly secured to a principal surface of the first circuit board; a second circuit element which is fixedly secured to a principal surface of the second circuit board and controls an operation of the first circuit element; a first sealing resin sealing the first circuit element in the case member, the first circuit element being fixedly secured to the first circuit board; and a second sealing resin covering the second circuit element which is fixedly secured to the second circuit board, wherein the case member is provided therein with a hollow portion which is not filled with the first sealing resin.

BRIEF DESCRIPTION OF THE DRAWINGS

FIG. 1A is a perspective view and FIG. 1B is a cross sectional view.

FIG. 2A is a cross sectional view, and FIG. 2B is an enlarged cross sectional view.

FIGS. 6A and 6B are views showing a hybrid integrated circuit device that is an embodiment of the circuit device of the present invention, wherein FIG. 6A is a cross sectional view and FIG. 6B is a plan view.

DESCRIPTION OF THE INVENTIONS

Figure 1A:
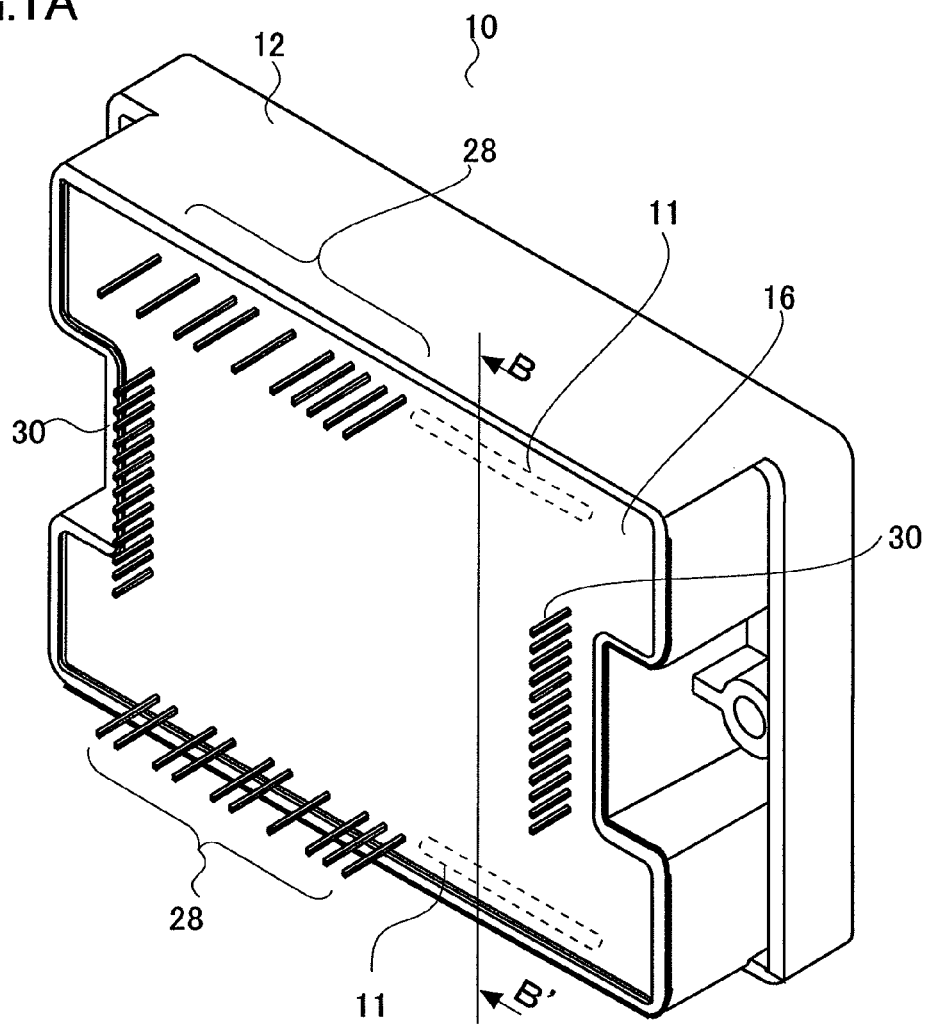
FIGS. 1A and 1B are views showing a hybrid integrated circuit device that is an embodiment of a circuit device of the present invention.

As an example of the circuit device, the configuration of a hybrid integrated circuit device 10 is described with reference to FIGS. 1A and 1B. FIG. 1A is a perspective view of the hybrid integrated circuit device 10, and FIG. 1B is a cross sectional view of FIG. 1A taken along a B-B' line.

Figure 1B:
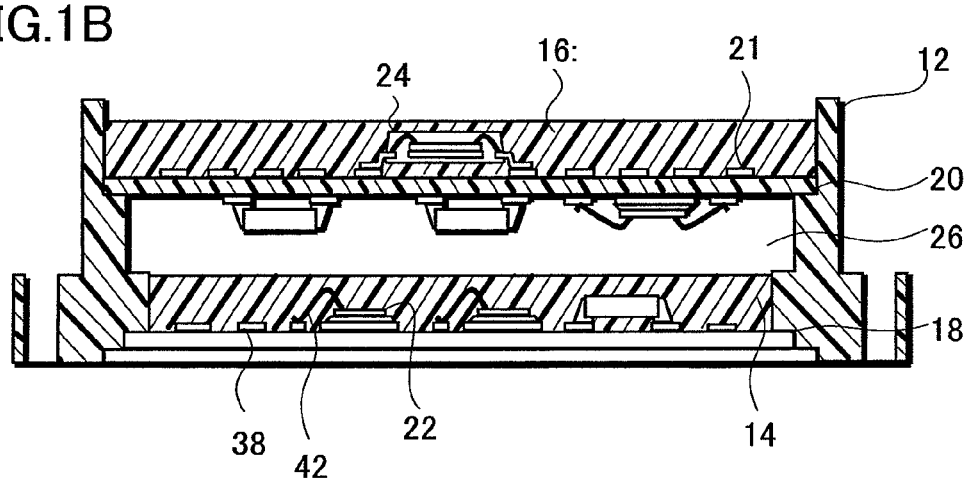

As shown in FIG. 1A and FIG. 1B, in the hybrid integrated circuit device 10, a first circuit board 18 is overlaid with a second circuit board 20 and both circuit boards are fitted into a case member 12. A first circuit element 22 (a power transistor, for example) is arranged on the upper surface of the first circuit board 18, and a second circuit element 24 (a microcomputer, for example) is arranged on the upper surface of the second circuit board 20. In addition, inside the case member 12, a hollow portion 26 which is not filled with a sealing resin is provided.

The case member 12 is formed by injection molding a thermosetting resin, such as an epoxy resin, or a thermoplastic resin, such as an acrylic resin, and exhibits an approximately frame-like shape. As shown in FIG. 1B, the upper surface and the lower surface of the case member 12 form openings, and the opening in the upper surface is covered with the second circuit board 20, and the opening in the lower surface is covered with the first circuit board 18. In addition, screw holes for fastening screws are provided at the left and right end portions of the case member 12, respectively.

The first circuit board 18 is fitted into the lower opening of the case member 12, and is made of either aluminum (Al), copper (Cu), or an alloy containing at least one of these metals as a primary material. Here, two metal substrates made of aluminum are employed as the first circuit board 18. However, the first circuit board 18 may be made of one metal substrate. The detail of the first circuit board 18 will be described with reference to FIG. 2B.

The second circuit board 20 is fitted into the opening on the upper side of the case member 12, and here a printed circuit board (PCB) is employed. Specifically, a paper phenol substrate, a glass epoxy substrate, or the like is employed as the second circuit board 20. Alternatively, a substrate made of ceramic may be employed as the second circuit board 20. In addition, a conductive pattern 21 may be formed only on the upper surface of the second circuit board 20, or the conductive pattern 21 may be provided on both sides thereof. In addition, the conductive pattern 21 stacked in three or more layers may be formed on the second circuit board 20.

As a second circuit element 24 mounted on the second circuit board 20, a microcomputer or the like having a smaller amount of heat generation than the first circuit element 22 mounted on the first circuit board 18 is mounted. Accordingly, as the second circuit board 20, a printed circuit board which is less thermally conductive but less expensive can be employed. With the low cost for a design modification and manufacturing, the printed circuit board, even when the specification of the microcomputer or the like employed as the second circuit element 24 has been modified, the modification can be easily made by modifying the shape of the conductive pattern of the second circuit board 20. In addition, the second circuit board 20 made of an insulating material, such as an epoxy resin, has a lower thermal conductivity than the first circuit board 18 made of a metal. Accordingly, the heat conduction is suppressed by the second circuit board 20, whereby the heat generated in the first circuit element 22, which is the power transistor, is prevented from being conducted to the second circuit element 24, which is the microcomputer.

The first circuit element 22 is an element electrically connected to the conductive pattern 38 formed on the upper surface of the first circuit board 18. As the first circuit element 22, a power transistor for switching a current equal to or more than one ampere is employed, for example. Here, a bipolar transistor, a field effect transistor (FET), or an insulated gate bipolar transistor (IGBT) is employed as the power transistor. In addition, as the first circuit element 22, an element other than the transistor also can be generally employed, and for example, an active element, such as an LSI or a diode, or a passive element, such as a chip capacitor or a chip resistor, is employed.

Additionally, if the first circuit element 22 is a semiconductor element, such as a power transistor, the rear surface thereof is fixedly secured via a conductive adhesive, such as solder. In addition, a heat sink made of a metal, such as copper, may be provided between the first circuit element 22 and the conductive pattern 38. Then, an electrode formed on the upper surface of the first circuit element 22 is connected to the conductive pattern 38 via a metal thin wire 42.

In addition, a diode constituting a rectifier circuit, a coil and a capacitor constituting a smoothing circuit, a driver IC which applies a control signal to the control electrode of the above-described power transistor, a thermistor, and the like are employed as the first circuit element 22.

The second circuit element 24 is an element electrically connected to the conductive pattern 21 formed in the surface of the second circuit board 20, and a circuit element having a lower operating temperature than the first circuit element is generally employed. As a specific example, for example, a microcomputer, an aluminum electrolytic capacitor, and the like are mounted on the second circuit board 20 as the second circuit element 24. In addition, as the second circuit element 24, an active element and a passive element are generally employed as is the case with the first circuit element 22. Alternatively, a crystal oscillator or a semiconductor memory may be employed as the second circuit element 24. In addition, the second circuit element 24 may be fixedly secured only to the upper surface of the second circuit board 20, or may be fixedly secured only to the lower surface, or may be fixedly secured to both sides.

Additionally, as shown in FIG. 1B, an LSI as the microcomputer is mounted on the upper surface of the second circuit board 20, in the form of a resin sealed package. However, the microcomputer may be fixedly secured to the conductive pattern 21 formed in the surface of the second circuit board 20, in the form of a bare chip.

The first sealing resin 14 is formed so as to cover the first circuit element 22 and the entire upper surface of the first circuit board 18. The first sealing resin 14 is made of a resin material, such as an epoxy resin in which a filler, such as alumina ($Al_2O_3$) or silica ($SiO_2$), is mixed. In this way, the moisture resistance of the first circuit element 22 is improved by the first circuit element 22 being sealed with the first sealing resin 14. In addition, since a connected portion (made of a bonding material, such as solder) between the first circuit element 22 and the conductive pattern 38 is covered with the first sealing resin 14, the vibration resistance of this connected portion is improved. In addition, the first sealing resin 14 made of a resin, in which a filler is mixed, has a light shielding property that does not allow light to pass therethrough. Accordingly, since the first sealing resin 14 having a light shielding property covers the conductive pattern 38 and the first circuit element 22, which are formed on the upper surface of the first circuit board 18, the shape of the conductive pattern 38 and the position of the first circuit element 22 may be concealed. Here, as shown in FIG. 1B, the first sealing resin 14 is formed so as to cover the first circuit element 22 and the metal thin wire 42 used for the connection thereof. However, the first circuit element 22 does not need to be completely covered with the first sealing resin 14. Alternatively, the upper end part of the first circuit element 22 may project upward from the upper surface of the first sealing resin 14 while the connected portion between the first circuit element 22 and the conductive pattern 38 are covered with the first sealing resin 14.

The first sealing resin 14 is formed inside of the side wall of the case member 12, specifically, in a space surrounded by the first circuit board 18, and the second circuit board 20, but the first sealing resin 14 is not formed so as to completely fill into this space. Accordingly, the hollow portion 26, in which the first sealing resin 14 is not filled, is provided in the internal space of the case member 12. In other words, the first sealing resin 14 is in contact with the first circuit board 18 and the first circuit element 22, but is not in contact with the second circuit board 20 and the second circuit element 24. In addition, the peripheral region of the upper surface of the first circuit board 18 is in contact with the case member 12 and the other region thereof is covered with the first sealing resin 14.

Furthermore, the hollow portion 26 may be sealed with the case member 12, the first circuit board 18, and the second circuit board 20, or may communicate with the outside. If the hollow portion 26 communicates with the outside, a communicating hole for allowing the hollow portion 26 to communicate with the outside may be provided, for example, in a side wall part of the case member 12 or in a portion between the case member 12 and the second circuit board 20.

The second sealing resin 16 is formed so as to cover the second circuit element 24 and the entire upper surface of the second circuit board 20, and is made of a resin material, in which a filler is mixed, as is the case with the first sealing resin 14. Since the second sealing resin 16 covers the second circuit element 24 and the second circuit board 20, the moisture resistance and the vibration resistance of the second circuit element 24 are improved and also the shape of the conductive pattern 21 provided on the upper surface of the second circuit board 20 and the arrangement of the second circuit element 24 are concealed. Here, the second sealing resin 16 does not necessarily need to be formed so as to completely cover the second circuit element 24. The second sealing resin 16 may be formed so that the upper part of the second circuit element 24 may project upward from the upper surface of the second sealing resin 16 while the connected portion between the second circuit element 24 and the conductive pattern 21 are covered.

As shown in FIG. 1A, the opening on the front side of the figure, of the case member 12 is entirely covered with the second sealing resin 16, and a first lead 28 and a second lead 30 are led from the surface of the second sealing resin 16 to the outside. The details of the first lead 28 and the second lead 30 will be described with reference to FIG. 2A. The first lead 28 and the second lead 30 serve as a connecting means for connecting a circuit provided inside the hybrid integrated circuit device 10 to the outside. Additionally, as shown in FIG. 1B, the first lead 28 and the second lead 30 serve also as a connecting means for electrically connecting the first circuit element 22 mounted on the first circuit board 18 and the second circuit element 24 mounted on the second circuit board 20.

As shown in FIG. 1B, in this embodiment, the first circuit element 22 arranged on the upper surface of the first circuit board 18 is sealed with the first sealing resin 14, and inside the case member 12 provided is the hollow portion 26, which is a space that is not sealed with a resin. This prevents the second circuit element 24 (in particular, a microcomputer) from misoperating due to a heat generated in the first circuit element 22.

Specifically, in this embodiment, by providing two overlaid circuit boards (the first circuit board 18 and second circuit board 20) and then mounting a circuit element into the respective circuit boards, a power block consisted of a power transistor and a control block for controlling this power block are incorporated in one package of the hybrid integrated circuit device 10. In order to improve the moisture resistance and the vibration resistance, the circuit elements mounted on each of the circuit boards need to be sealed with a sealing resin. For example, with reference to FIG. 1B, the first sealing resin 14 is formed inside the case member 12 so as to cover the first circuit element 22 arranged on the first circuit board 18, and furthermore, the second sealing resin 16 is formed so as to cover the second circuit element 24 fixedly secured to the upper surface of the second circuit board 20.

Here, for example, considering a case where a power transistor is employed as the first circuit element 22 and a microcomputer is employed as the second circuit element, the microcomputer may cause a misoperation due to a heat generated in the power transistor. Specifically, during operation of the hybrid integrated circuit device 10, the temperature Tc outside the device is guaranteed so as not to be more than 100° C. and the temperature (Tj) of the first circuit element 22 incorporated into the device is guaranteed so as not to be higher than 150° C. On the other hand, the upper limit of the normal operating temperature of the microcomputer, which is the second circuit element 24, is lower than that of the power transistor, such as an IGBT, and is not higher than 85° C., for example. Accordingly, if the first sealing resin 14 is formed so as to completely fill the internal space of the case member 12, a heat generated in the first circuit element 22 conducts to the second circuit element 24, which is the microcomputer, via the first sealing resin 14. As a result, the second circuit element 24, which is the microcomputer, is heated to 85° C. or higher and the operation thereof may become unstable.

For this reason, in this embodiment, as shown in FIG. 1B, the inside of the case member 12 is not completely filled with the first sealing resin 14 for sealing the first circuit element 22, so that the hollow portion 26, which is an unfilled region in which the first sealing resin 14 is not filled, is provided in the internal space of the case member 12. With this configuration, air remains in the hollow portion 26. Accordingly, even if a heat generated in the first circuit element 22, which is a power transistor, is conducted to the first sealing resin 14, the hollow portion 26 consisted of an air having a high thermal resistance prevents the heat from conducting to the second circuit element 24 (microcomputer). Accordingly, the temperature of the second circuit element 24, which is a microcomputer, is prevented from being overheated to no lower than an upper limit of the normal operating temperature (85° C., for example), and thus the microcomputer can operate stably.

Furthermore, when an aluminum electrolytic capacitor, which is likely to be deteriorated due to heating, is employed as the second circuit element 24, the configuration of this embodiment described above can prevent the aluminum electrolytic capacitor from increasing its temperature as well as from being deteriorated.

Additionally, as described above, since the first sealing resin 14 is made of a resin in which a filler is mixed, and has a low thermal resistance, the heat generated in the first circuit element 22 is easily conducted to other constituent elements via the first sealing resin 14. However, in this embodiment, as described above, the heat transfer is restricted by providing the hollow portion 26 in the case member 12, so that the misoperation of the second circuit element 24 due to the heat generated in the first circuit element 22 can be prevented.

Figure 2A:
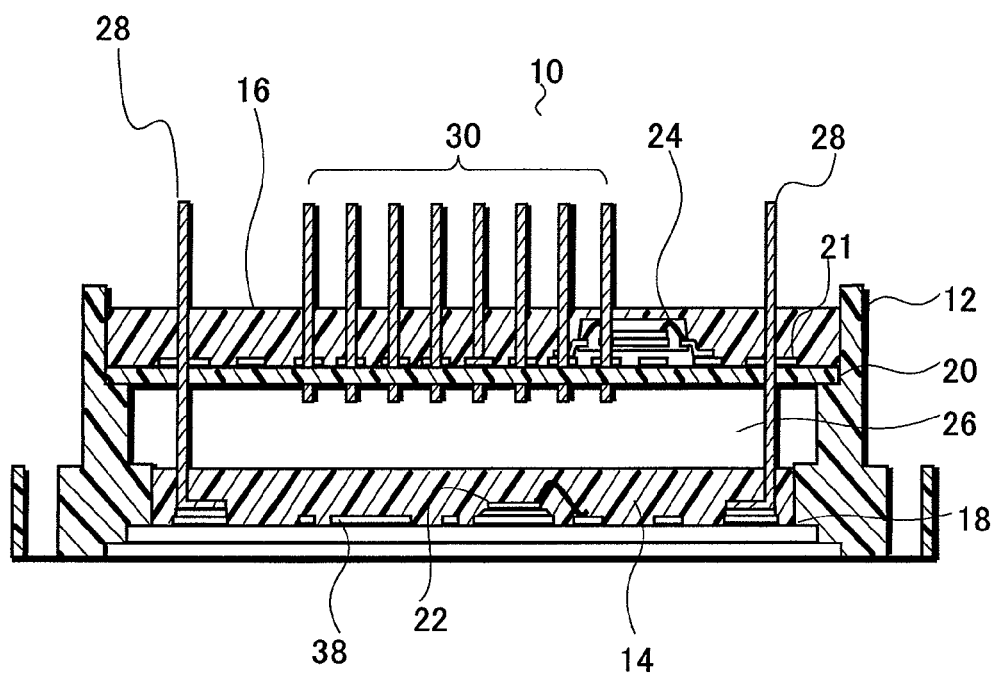
FIGS. 2A and 2B are views showing the hybrid integrated circuit device that is the embodiment of the circuit device of the present invention.
Figure 2B:
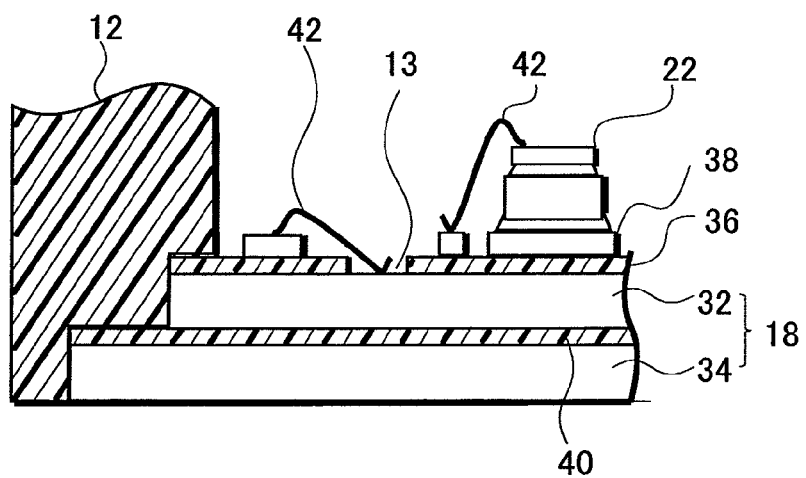

The configuration of the above-described hybrid integrated circuit device 10 is further described with reference to FIG. 2A and FIG. 2B. FIG. 2A is a cross sectional view of the hybrid integrated circuit device 10 for illustrating the configuration of leads, and FIG. 2B is a cross sectional view for explaining the configuration of the first circuit board 18.

As shown in FIG. 2A, the first lead 28 and the second lead 30 are provided in the hybrid integrated circuit device 10.

The lower end of the first lead 28 is fixedly secured to a pad consisted of a conductive pattern 38 formed on the upper surface of the first circuit board 18. The lower end of the first lead 28 is bonded to the pad-like conductive pattern 38 via a conductive adhesive, such as solder. The upper end of the first lead 28 is led to the outside penetrating the first sealing resin 14, the second circuit board 20, and the second sealing resin 16. Here, in a portion where the first lead 28 penetrates the second circuit board 20, the first lead 28 is sometimes connected to the conducted pattern 21 formed on the upper surface of the second circuit board 20 or is sometimes not connected thereto. The cases where the first lead 28 is connected to the conducted pattern 21 include a case where the second circuit element 24 mounted on the second circuit board 20 and the first circuit element 22 mounted on the first circuit board 18 are electrically connected to each other via the first lead 28. Meanwhile, the cases where the first lead 28 and the conducted pattern 21 are not connected to each other may include, for example, a case where a power supply current supplied from the outside or a current converted by an inverter circuit provided in the first circuit board 18 passes through the first lead 28 so as to be supplied to the outside.

The lower end of the second lead 30 is connected to the conductive pattern 21 provided on the upper surface of the second circuit board 20 and the upper end thereof projects upward penetrating the second sealing resin 16. The lower end of the second lead 30 is inserted into a pore which is provided penetrating the second circuit board 20, and a portion near the lower end thereof is secured to the pore. This portion has a function to allow an electric signal, which is inputted to and outputted from the second circuit element 24 mounted on the second circuit board 20, to pass therethrough. Here, the conductive pattern 21 formed on the upper surface of the second circuit board 20 and the second lead 30 are connected to each other via a conductive adhesive, such as solder.

As shown in FIG. 2B, in this embodiment, the first circuit board 18 is formed by stacking a mounting substrate 32 on an insulating substrate 34.

The mounting substrate 32 is a metal substrate containing aluminum (Al) as the primary material, with the thickness of around 1.0 mm to 2.0 mm and the upper surface and the lower surface thereof are covered with anodic oxide film (a film made of $Al_2O_3$). The upper surface of the mounting substrate 32 is covered with an insulating layer 36 made of a resin material, such as an epoxy resin in which a filler is highly filled. The thickness of the insulating layer 36 is around 50 μm for example. In addition, the conductive pattern 38 with the thickness of around 50 μm made of copper is formed on the upper surface of the insulating layer 36, and the first circuit element 22 is mounted on the conductive pattern 38.

Additionally, an exposed portion 13 is provided by partially removing the insulating layer 36, and the mounting substrate 32 appeared from the exposed portion 13 and the conductive pattern 38 are connected to each other via the metal thin wire 42. Connecting the mounting substrate 32 and the conductive pattern 38 to each other via the exposed portion 13 in this way allows the potential of the mounting substrate 32 to be set at a fixed potential (earth potential or power supply potential). Accordingly, the mounting substrate 32 contributes to the increase of the shielding effect for shielding noise from the outside. In addition, since the potentials of a part of the conductive pattern 38 and the mounting substrate 32 become the same, a parasitic capacitance occurring between both can be reduced.

The rear surface of the mounting substrate 32 having the above-described structure is bonded to the upper surface of the insulating substrate 34 via an adhesive made of a silicon resin.

The insulating substrate 34 is made of a metal, such as aluminum, as is the case with the mounting substrate 32, and the plane size thereof is formed larger than that of the mounting substrate 32. Accordingly, the end portion of the insulating substrate 34 is spaced apart from the end portion of the mounting substrate 32. Additionally, the upper surface of the insulating substrate 34 is covered with an insulating layer 40 made of a resin material, such as a polyimide resin. In addition, the lower surface of the insulating substrate 34 is arranged on the same plane as the lower end of the side wall of the case member 12.

As described above, both of the heat release property and the withstand voltage of the first circuit board 18 can be kept at a high level with the configuration of the first circuit board 18 by stacking the mounting substrate 32 on the insulating substrate 34. Specifically, as described above, since the mounting substrate 32 is connected to the earth potential for example, by being connected to the conductive pattern 38, an exposure of the rear surface of the mounting substrate 32 to the outside might cause a short circuit. The insulating substrate 34 is provided in order to prevent this short circuit. The upper surface of the insulating substrate 34 and the lower surface of the mounting substrate 32 are insulated from each other by the insulating layer 40 provided on the upper surface of the insulating substrate 34. In addition, the side surface of the mounting substrate 32 and the side surface of the insulating substrate 34 are prevented from being short-circuited to each other by keeping a distance between the end portion (side surface) of the insulating substrate 34 and the end portion (side surface) of the mounting substrate 32, although the side surfaces of both substrates are the surfaces where a metallic material, such as aluminum, constituting the respective substrates appears.

In addition, since both of the mounting substrate 32 and the insulating substrate 34 are made of a metal, such as aluminum being excellent in heat release property, a heat generated in the first circuit element 22 is excellently released to the outside via the mounting substrate 32 and the insulating substrate 34.

Figure 3:
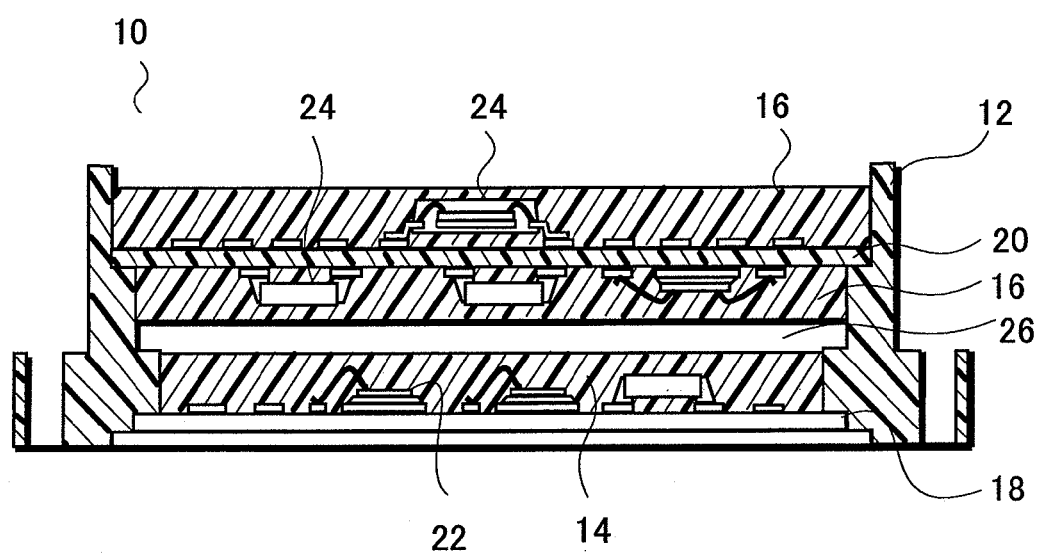
FIG. 3 is a cross sectional view showing a hybrid integrated circuit device that is an embodiment of the circuit device of the present invention.

Another form of the hybrid integrated circuit device 10 is described with reference to FIG. 3. Here, the second circuit elements 24 are mounted respectively on both of the upper surface and the lower surface of the second circuit board 20. The second sealing resin 16 is formed so as to cover both of the upper surfaces and the lower surfaces of the second circuit elements 24 and the second circuit board 20.

By providing the second circuit element 24 also on the lower surface of the second circuit board 20 in this way, a greater number of circuit elements can be incorporated in the hybrid integrated circuit device 10. In addition, the second circuit element 24 provided on the rear surface of the second circuit board 20 is sealed with the second sealing resin 16, thereby improving the moisture resistance and the vibration resistance of these elements.

Additionally, even in such a case, the inside of the case member 12 is not completely filled with the sealing resin. Although the upper part of the internal space of the case member 12 is filled with the second sealing resin 16 and the lower part thereof is filled with the first sealing resin 14, the hollow portion 26, which is not filled with the sealing resin, is left between both. The hollow portion 26 has a function to prevent a heat from being conducted to the second circuit element 24, the heat being generated in the first circuit element 22 that is a power transistor, as described above.

Figure 4:
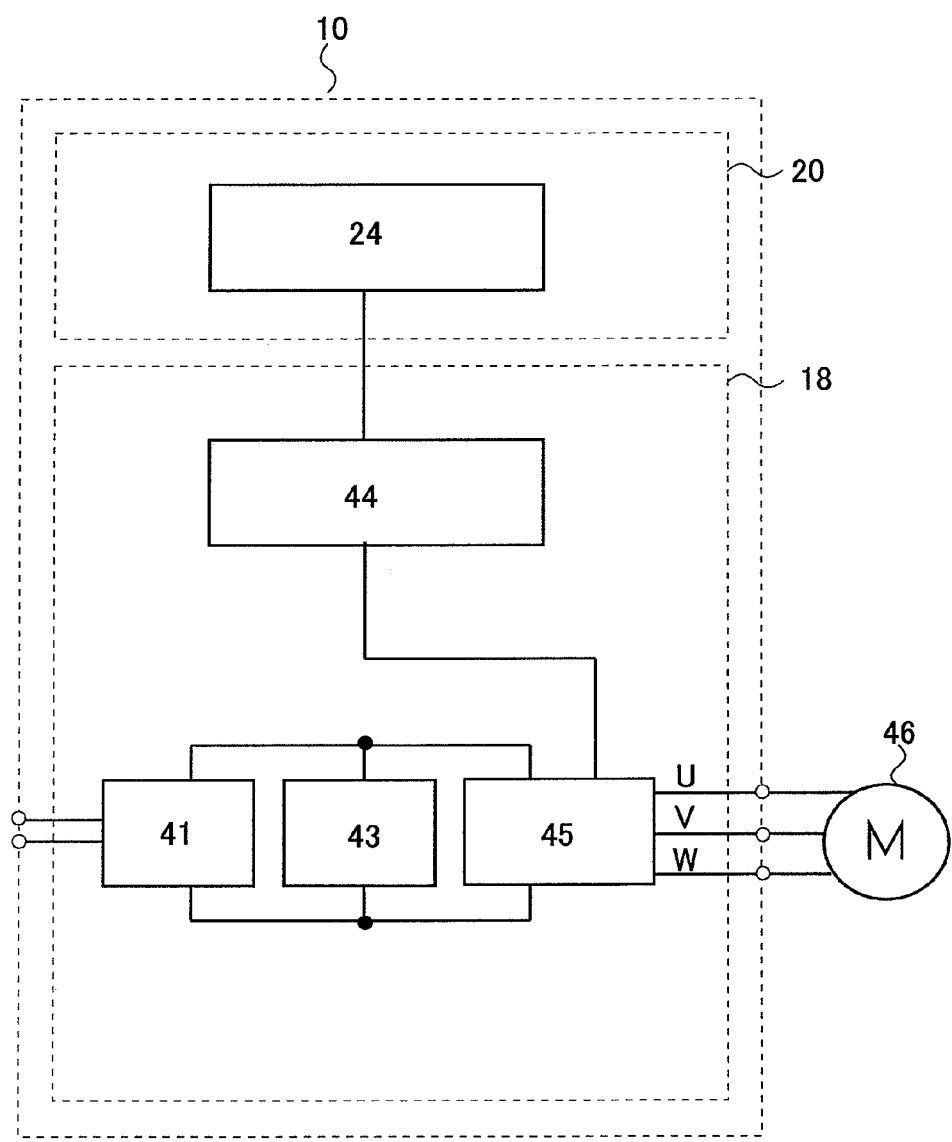
FIG. 4 is a block diagram showing a circuit incorporated in the hybrid integrated circuit device that is the embodiment of the circuit device of the present invention.

Next, an example of the circuit built in the hybrid integrated circuit device 10 is described with reference to FIG. 4. Here, an inverter circuit including a switching circuit 45 consisted of a plurality of power transistors is formed on the first circuit board 18, while the second circuit element 24 (microcomputer) in which a control circuit for controlling this inverter circuit is configured is mounted on the second circuit board 20. More specifically, a rectifier circuit 41, a smoothing circuit 43, a switching circuit 45, and a driver IC 44 are mounted in the first circuit board 18.

The operation of each of the circuits incorporated in the hybrid integrated circuit device 10 is described below. Firstly, a reference signal having a frequency corresponding to a rotational speed is inputted to the second circuit element 24 (microcomputer) mounted on the second circuit board 20, so that three sinewave control signals each having a pulse width being modulated and a phase difference by 120 degrees are generated. The control signal generated by the second circuit element 24 is inputted to the first circuit board 18 via the first lead 28 (see FIG. 2A).

The control signal inputted to the first circuit board 18 is boosted to a specified voltage by a driver IC 44 and then is applied to a control electrode of a power transistor (IGBT, for example) constituting the switching circuit 45.

On the other hand, an alternating current power inputted from the outside is converted into a direct current power by the rectifier circuit 41, and then the voltage thereof is kept constant by the smoothing circuit 43, and this voltage is inputted to the switching circuit 45.

Then, the switching circuit 45 generates three-phase pulse-width-modulated sinewave voltages (U, V, W), each having a phase difference by 120 degrees, and the voltages thus generated are supplied to a motor 46. As a result, a load current that approximates the sinewave flows into the motor 46, so that the motor 46 rotates at a predetermined number of rotations.

A large amount of heat is generated in the power transistor included in the switching circuit 45 by the operation of the switching circuit 45. However, as shown in FIG. 1B, since the first circuit element 22, which is the power transistor, and the second circuit element 24, which is a microcomputer, are thermally insulated from each other with the hollow portion 26, the second circuit element 24 is prevented from misoperating due to a heat generated in the first circuit element 22.

Figure 5A:
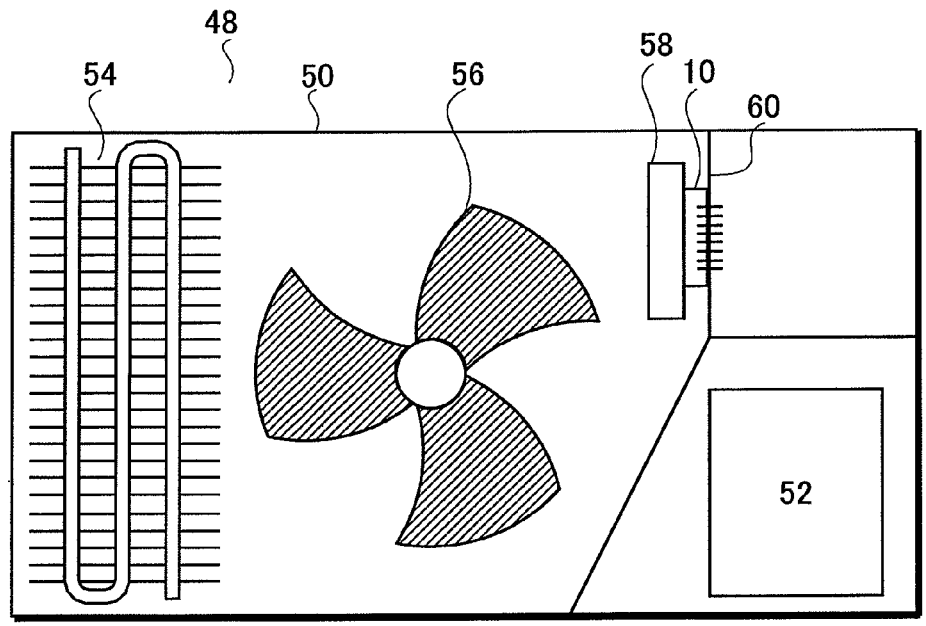
FIG. 5A is a view showing an outdoor unit, into which the hybrid integrated circuit device that is the embodiment of the circuit device of the present invention is incorporated.

Next, the configuration of an outdoor unit 48 of an air conditioner, in which the hybrid integrated circuit device 10 having the above-described configuration is incorporated, is described with reference to FIG. 5A.

The outdoor unit 48 mainly includes a condenser 54, a fan 56, a compressor 52, and the hybrid integrated circuit device 10 which are mounted inside a housing 50.

The compressor 52 has a function to compress a refrigerant, such as ammonia, using the driving force of the motor. Then, the refrigerant compressed by the compressor 52 is delivered to the condenser 54, and the wind from the fan 56 blows to the condenser 54. Accordingly a heat contained in the refrigerant inside the condenser 54 is released to the outside. In addition, after being expanded, this refrigerant is delivered to an evaporator existing in the room so as to cool the air in the room.

The hybrid integrated circuit device 10 of this form has a function to control the rotation of the motor for driving the compressor 52 or the fan 56, and is fixedly secured to a mounting substrate 60 provided inside the outdoor unit 48.

Figure 5B:
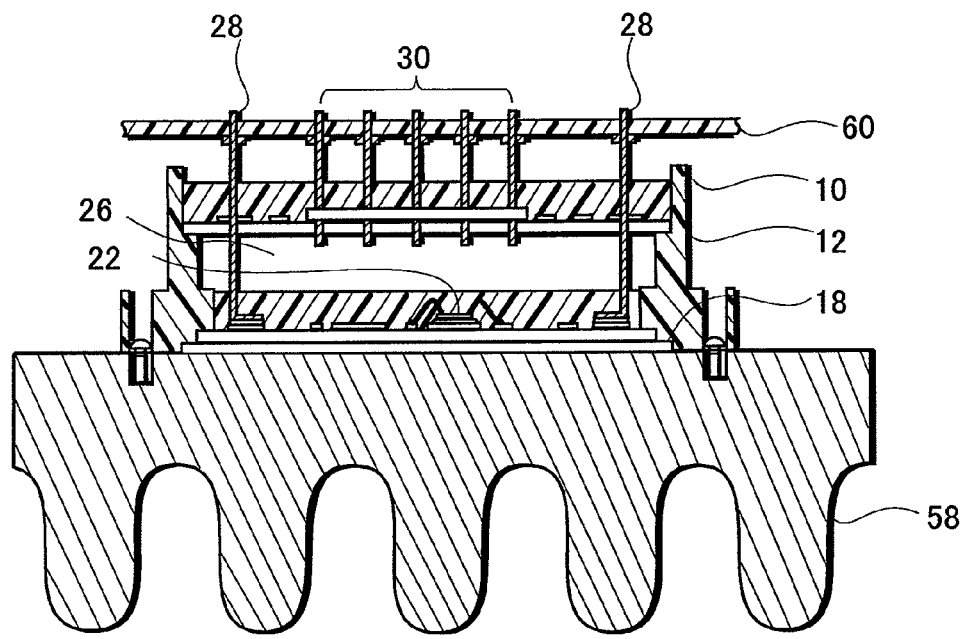
FIG. 5B is a cross sectional view of a portion to which the hybrid integrated circuit device is attached.

FIG. 5B shows a structure how the hybrid integrated circuit device 10 is mounted. Here, the first lead 28 and the second lead 30 are inserted into the mounting substrate 60 to be mounted thereon. The rear surface of the first circuit board 18 on which the power transistors are mounted is in contact with a smooth surface of a heat sink 58. The hybrid integrated circuit device 10 can be attached to the heat sink 58 by screwing the case member 12 of the hybrid integrated circuit device 10 into the heat sink 58. Here, the heat sink 58 is formed by integrally molding a metal, such as copper or aluminum. The surface of the heat sink being in contact with the hybrid integrated circuit device 10 is smooth, and the surface opposite thereto is irregular. With such a configuration, a heat generated in the first circuit element 22, which is the power transistor, is conducted to the internal space of the outdoor unit 48 via the first circuit board 18 and the heat sink 58, and is finally released to the outside of the outdoor unit 48 by the blowing operation of the fan 56.

Figure 6A:
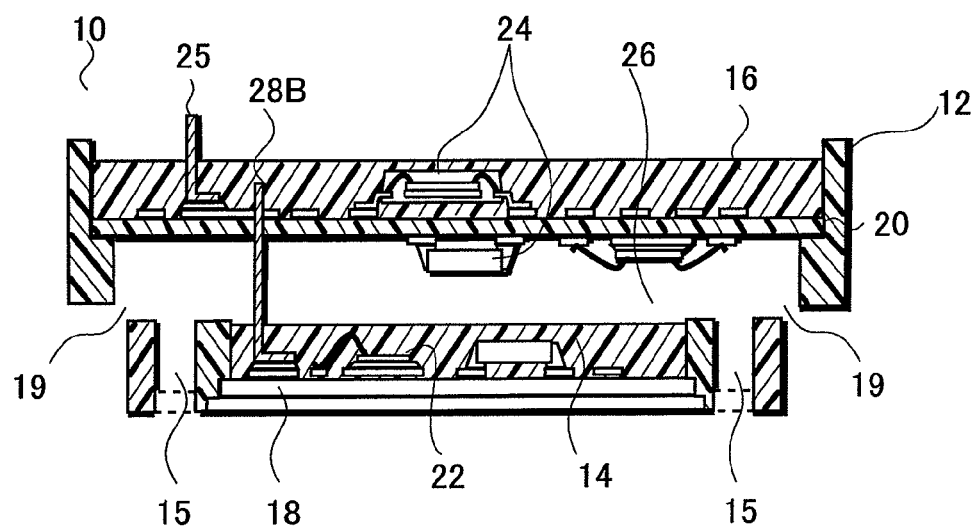
Figure 6B:
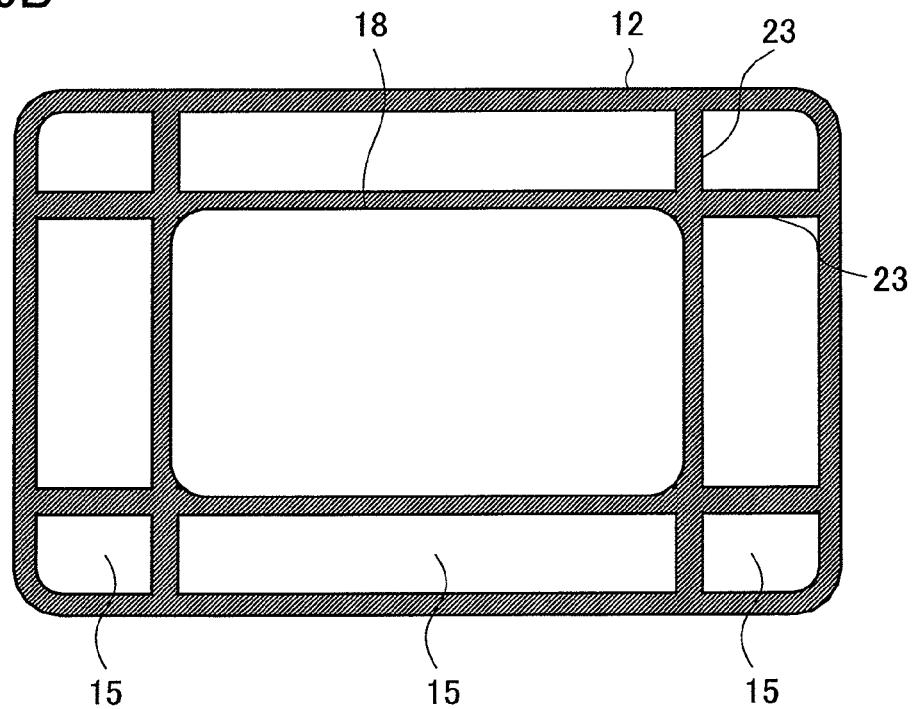
Figure 7:
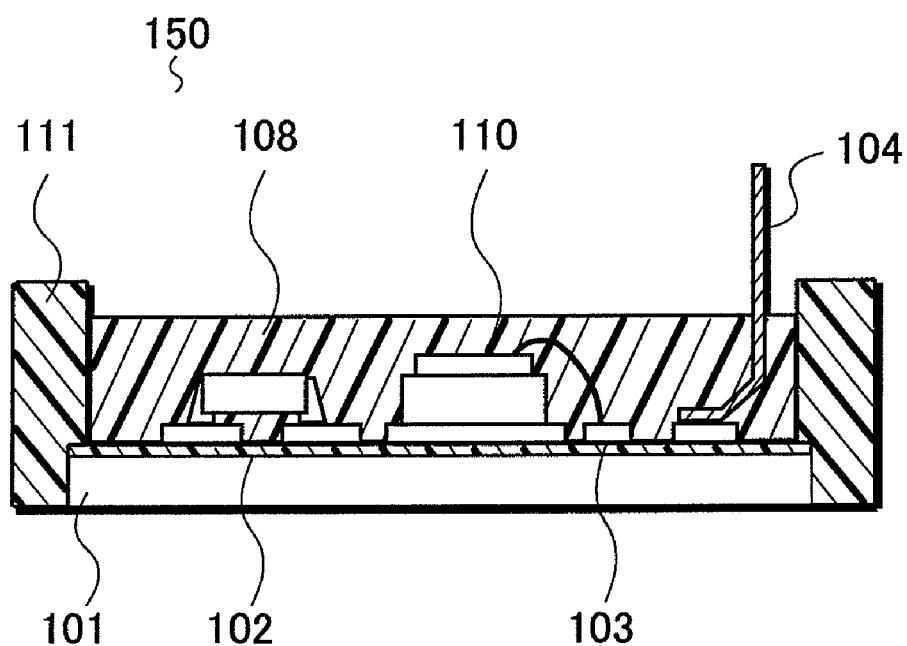
FIG. 7 is a cross sectional view showing a hybrid integrated circuit device described in the background of the invention.

The configuration of another form of the hybrid integrated circuit device 10 is described with reference to FIG. 6. FIG. 6A is a cross sectional view of the hybrid integrated circuit device 10, and FIG. 6B is a plan view of the hybrid integrated circuit device 10 when viewed from below. The basic configuration of this device shown in FIGS. 6A and 6B is the same as above, and the difference therebetween lies in that the communicating openings 15, 19 are provided in the lower surface as well as the side surface of the case member.

As shown in FIG. 6A, the first circuit board 18 on which a power transistor is arranged is formed smaller than the second circuit board 20 on which controlling elements, such as a microcomputer, are arranged. Since the case member 12 has such a size large enough to house a larger second circuit board 20, a space is produced in the periphery of the first circuit board 18 when the first circuit board 18 is arranged in the center portion of the case member 12. Here, the communicating opening 15 is provided in the bottom of the case member 12 in the periphery of the first circuit board 18. With this configuration, the air having high temperature in the hollow portion 26 inside the device is released to the outside through the communicating opening 15. At the same time, the unheated air is admitted into the hollow portion 26 through the communicating opening 15. In addition, a communicating opening 19 is provided by partially opening the side wall part of the case member 12, and this communicating opening 19 has the same function as that of the communicating opening 15.

As shown in FIG. 6B, a supporting part 23 in a frame form is provided in the case member 12 to support the first circuit board 18 near the center portion of the case member 12. The communicating openings 15 are provided on the rear surface of the case member 12, in the periphery of the first circuit board 18.

In addition, as shown in FIG. 6A, an output signal from the switching circuit formed on the upper surface of the first circuit element 22 may be outputted to the outside via both of a lead fixedly secured to the upper surface of the first circuit board 18 and a lead fixedly secured to the second circuit board 20. In addition, a high current of the source power or the like may be inputted to the inside of the device via both of the leads. Specifically, a lead 28B is fixedly secured to the upper surface of the first circuit board 18, and the lead 28B is connected to the first circuit element 22 constituting the switching circuit. The upper end of the lead 28B penetrates the second circuit board 20 to be connected to a conductive pattern formed on the upper surface of the second circuit board 20. Additionally, the upper end part of the lead 28B is not led to the outside.

A lead 25 that is formed thicker than the lead 28B is fixedly secured to the upper surface of the second circuit board 20, and the lead 25 is connected to the lead 28B via the conductive pattern formed on the upper surface of the second circuit board 20. This configuration allows an output from the first circuit element 22 to be taken out to the outside via the lead 28B and the lead 25, the first circuit element 22 being arranged on the upper surface of the first circuit board 18.

Additionally, a small signal, such as a control signal or an input to a sensor, may be inputted and outputted through a plug-in type connector mounted on the upper surface of the second circuit board 20.

In the present invention, the first circuit board and the second circuit board are provided inside the case member, the first circuit element fixedly secured to the upper surface of the first circuit board is sealed with a resin, and the first circuit element and the second circuit element are thermally separated from each other with the hollow portion provided inside the case member.

With this configuration, a heat generated in the power transistor is insulated with the hollow portion, for example, when a power transistor is employed as the first circuit element mounted on the first circuit board and a microcomputer is employed as the second circuit element mounted on the second circuit board,. Accordingly, the microcomputer having an upper limit of the operating temperature, for example, about 85 degrees, is prevented from misoperating due to a heat generated in the power transistor.

What is claimed is:

1. A circuit device, comprising:
   a case member;
   a first circuit board attached to a bottom portion of the case member;
   a second circuit board fitted into the case member so as to define an internal space between the first and second circuit boards;
   a semiconductor element mounted on a principal surface of the first circuit board; and
   a circuit element mounted on a principal surface of the second circuit board and controlling the semiconductor element,
   wherein the first circuit board is smaller than the second circuit board,
   the bottom portion of the case member comprises a lattice-like frame having a center lattice cell opening into which the first circuit board fits and a peripheral lattice cell opening that is connected to the internal space of the case member so that the internal space and the peripheral opening of the bottom portion form a conduit for air flow, and
   a bottom surface of the first circuit board opposite from the principal surface on which the semiconductor element is mounted is not covered by any device element of the circuit device so that the bottom surface of the first circuit board is exposed.

2. The circuit device of claim 1, further comprising a sealing resin covering at least the principal surface of the first circuit board and the semiconductor element.

3. The circuit device of claim 1, wherein the lattice-like frame of the case member has a plurality of peripheral lattice cell openings connected to the internal space of the case member, and in plan view of the circuit device the first circuit board is surrounded by the peripheral lattice cell openings.

4. The circuit device of claim 1, wherein a sidewall of the case member has an opening connected to the internal space of the case member.

5. The circuit device of claim 1, wherein the peripheral lattice cell opening in the lattice-like frame is covered by the second circuit board.

6. The circuit device of claim 1, further comprising a conductive pad and a lead disposed on the conductive pad and penetrating through the second circuit board, wherein the semiconductor element and the circuit element are connected through the lead.

7. A circuit device, comprising:
   a case member comprising a bottom portion and a sidewall portion, the bottom portion comprising a lattice-like frame having a center lattice cell opening in a middle portion of the lattice-like frame and also having additional lattice cell openings surrounding the center lattice cell opening;
   a first circuit board mechanically engaging with the center lattice cell opening of the lattice-like frame;
   a second circuit board fitted into the case member by mechanically engaging with the sidewall of the case member, the first and second circuit boards and the sidewall of the case member defining an internal space of the circuit device, the first circuit board being smaller than the second circuit board, and the internal space and the additional lattice cell openings being connected to form a conduit for air flow;
   a semiconductor element mounted on the first circuit board; and
   a circuit element mounted on the second circuit board and controlling the semiconductor element.

* * * * *